(12) United States Patent
Hiyama et al.

(10) Patent No.: US 7,638,826 B2
(45) Date of Patent: Dec. 29, 2009

(54) IMAGING DEVICE AND IMAGING SYSTEM

(75) Inventors: Hiroki Hiyama, Zama (JP); Masanori Ogura, Atsugi (JP); Seiichiro Sakai, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 11/214,806

(22) Filed: Aug. 31, 2005

(65) Prior Publication Data
US 2006/0043440 A1 Mar. 2, 2006

(30) Foreign Application Priority Data
Sep. 1, 2004 (JP) ............................ 2004-254358

(51) Int. Cl.
*H01L 31/062* (2006.01)
(52) U.S. Cl. ..................... 257/291; 257/231; 257/232; 257/290; 257/292; 257/E27.131; 257/E27.132; 257/E27.133
(58) Field of Classification Search ................ 257/291, 257/292, 231, 232, 290, E27.131, E27.132, 257/E27.133
See application file for complete search history.

(56) References Cited

U.S. PATENT DOCUMENTS

| | | | | |
|---|---|---|---|---|
| 4,663,669 A | | 5/1987 | Kinoshita et al. | ...... 358/213.19 |
| 4,774,585 A | | 9/1988 | Suga et al. | ............. 358/213.19 |
| 4,780,764 A | | 10/1988 | Kinoshita et al. | ...... 358/213.19 |
| 4,821,105 A | | 4/1989 | Suga et al. | ............. 358/213.19 |
| 5,121,225 A | | 6/1992 | Murata et al. | ................ 358/471 |
| 5,261,013 A | | 11/1993 | Murata et al. | .................. 382/65 |
| 5,475,211 A | | 12/1995 | Ogura et al. | ............. 250/208.1 |
| 5,955,753 A | | 9/1999 | Takahashi | .................... 257/292 |
| 6,040,592 A | * | 3/2000 | McDaniel et al. | ........... 257/292 |
| 6,051,857 A | * | 4/2000 | Miida | ......................... 257/292 |
| 6,124,888 A | * | 9/2000 | Terada et al. | ................. 348/302 |
| 6,188,094 B1 | | 2/2001 | Kochi et al. | .................. 257/232 |
| 6,218,656 B1 | * | 4/2001 | Guidash | .................. 250/208.1 |
| 6,352,869 B1 | * | 3/2002 | Guidash | ...................... 438/16 |

(Continued)

FOREIGN PATENT DOCUMENTS

EP 1 017 106 A2 7/2000

(Continued)

OTHER PUBLICATIONS

Guidash et al., "A 0.6 micrometer CMOS Pinned Photodiode Color Imager Technology", IEDM, 1997, pp. 927-929.*

(Continued)

*Primary Examiner*—Eugene Lee
*Assistant Examiner*—Peniel M Gumedzoe
(74) *Attorney, Agent, or Firm*—Fitzpatrick, Cella, Harper & Scinto

(57) ABSTRACT

An object of the present invention is to prevent a sensitivity difference between pixels. There are disposed plural unit cells each including plural photodiodes 101A and 101B, plural transfer MOSFETs 102A and 102B arranged corresponding to the plural photodiodes, respectively, and a common MOSFET 104 which amplifies and outputs signals read from the plural photodiodes. Each pair within the unit cell, composed of the photodiode and the transfer MOSFET provided corresponding to the photodiode, has translational symmetry with respect to one another. Within the unit cell, there are included a reset MOSFET and selecting MOSFET.

2 Claims, 10 Drawing Sheets

U.S. PATENT DOCUMENTS

| | | | |
|---|---|---|---|
| 6,423,994 B1 * | 7/2002 | Guidash | 257/292 |
| 6,486,913 B1 * | 11/2002 | Afghahi et al. | 348/308 |
| 6,605,850 B1 | 8/2003 | Kochi et al. | 257/431 |
| 6,633,334 B1 * | 10/2003 | Sakurai et al. | 348/308 |
| 6,657,665 B1 * | 12/2003 | Guidash | 348/308 |
| 6,670,990 B1 | 12/2003 | Kochi et al. | 348/310 |
| 6,801,253 B1 | 10/2004 | Yonemoto et al. | 348/241 |
| 6,946,637 B2 | 9/2005 | Kochi et al. | 250/208.1 |
| 6,960,751 B2 | 11/2005 | Hiyama et al. | 250/208.1 |
| 7,110,030 B1 | 9/2006 | Kochi et al. | 348/308 |
| 2003/0164887 A1 | 9/2003 | Koizumi et al. | 348/308 |
| 2005/0098805 A1 | 5/2005 | Okita et al. | 257/292 |
| 2005/0122418 A1 | 6/2005 | Okita et al. | 348/308 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0205902 A1 * | 9/2005 | Hara et al. | 257/291 |
| 2005/0237405 A1 * | 10/2005 | Ohkawa | 348/308 |
| 2005/0268960 A1 | 12/2005 | Hiyama et al. | 136/244 |
| 2005/0269604 A1 | 12/2005 | Koizumi et al. | 257/291 |
| 2006/0027843 A1 | 2/2006 | Ogura et al. | 257/291 |
| 2006/0043393 A1 | 3/2006 | Okita et al. | 257/93 |
| 2006/0044434 A1 | 3/2006 | Okita et al. | 348/294 |
| 2006/0044439 A1 | 3/2006 | Hiyama et al. | 348/308 |
| 2006/0208161 A1 | 9/2006 | Okita et al. | 250/208.1 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |

FOREIGN PATENT DOCUMENTS

| | | |
|---|---|---|
| JP | 9-46596 | 2/1997 |
| JP | 11-122532 | 4/1999 |
| JP | 2000-232216 | 8/2000 |
| JP | 2001-298177 | 10/2001 |
| JP | 2001-298177 A | 10/2001 |

OTHER PUBLICATIONS

Mitsuyoshi et al., "¼-Inch 2-Mpixel MOS Image Sensor With 1.75 Transistor/Pixel", IEEE Journal of Solid-State Circuits, vol. 39, No. 12, Dec. 2004.*

Chapman et al., Creating 35 mm Camera Active Pixel Sensors, Proceedings of IEEE International Symposium on Defect and Fault Tolerance in VLSI Systems, Nov. 1999, pp. 22-30.*

* cited by examiner

FIG. 10

| Gb | B | Gb | B |
|---|---|---|---|
| R | Gr | R | Gr |
| Gb | B | Gb | B |
| R | Gr | R | Gr |

IMAGING DEVICE AND IMAGING SYSTEM

BACKGROUND OF THE INVENTION

1. Field of the Invention

The present invention relates to imaging devices and imaging systems, and more particularly to an imaging device having disposed therein plural unit cells including plural photoelectric conversion regions, plural transfer switch means provided corresponding to the plural photoelectric conversion regions, respectively, and common amplification means which amplifies and outputs signals read from the plural photoelectric conversion regions.

2. Related Background Art

In recent years, imaging devices called a CMOS sensor using CMOS process are attracting attention. By virtue of integratability of peripheral circuitry, low-voltage drive, and so on, the CMOS sensor is being increasingly applied particularly to the field of mobile information devices.

As a pixel configuration of CMOS sensors with a high. S/N ratio, for example, there has been known one in which a transfer switch is disposed between a photodiode and the input of a pixel amplifier as disclosed in Japanese Patent Application Laid-Open No. H11-122532. However, the drawbacks of this pixel configuration include a fact that since the number of transistors is large, when the pixel is scaled down, it is difficult to secure a sufficient area for the photodiode under constraint of the area required for the transistor. In order to overcome this disadvantage, there has recently been known a configuration in which plural adjacent pixels share a transistor, as disclosed, for example, in Japanese Patent Application Laid-Open No. H09-046596 (corresponding to U.S. Pat. No. 5,955,753). FIG. 12 (identical to FIG. 8 in the same patent application) shows the imaging device of conventional art. In the drawing, reference numeral 3 denotes a transfer MOS transistor acting as a transfer switch; 4 a reset MOS transistor which supplies a reset potential; 5 a source-follower MOS transistor; 6 a horizontal selecting MOS transistor for selectively allowing the source-follower MOS transistor 5 to output a signal; 7 a source-follower load MOS transistor; 8 a dark output transfer MOS transistor for transferring a dark output signal; 9 a bright output transfer MOS transistor for transferring a bright output signal; 10 a dark output accumulation capacitor CTN for accumulating the dark output signal; 11 a bright output accumulation capacitor CTS for accumulating the bright output signal; 12 a horizontal transfer MOS transistor for transferring the dark output signal and bright output signal to a horizontal output line; 13 a horizontal output line reset MOS transistor for resetting the horizontal output line; 14 a differential output amplifier; 15 a horizontal scanning circuit; 16 a vertical scanning circuit; 24 an embedded photodiode. Here, the dark output signal is a signal generated by resetting the gate region of the source-follower MOS transistors 5; the bright output signal is a signal obtained by combining a signal obtained by photoelectric conversion using the photodiode 24 and the dark output signal. From the differential output amplifier, there is obtained a signal with reduced fluctuation of the source-follower MOS transistor 5.

As evident from the drawing, one source-follower MOS transistor 5 is connected to two photodiodes 24 disposed in a vertical direction via transfer MOS transistors 3. Accordingly, while eight MOS transistors are required for two pixels in the conventional art, it is sufficient to provide five MOS transistors, thus being advantageous in miniaturization. By sharing the transistor, the number of transistors per pixel is reduced, whereby the area for the photodiode can be sufficiently secured.

Also, as an exemplary pixel layout of the shared-transistor configuration, there is one disclosed in Japanese Patent Application Laid-Open No. 2000-232216 (corresponding to EP1017106A).

The present inventor has found that, in the above described CMOS sensor having a shared-transistor configuration disclosed in Japanese Patent Application Laid-Open No. H09-046596, a sensitivity difference between pixels is more likely to arise relative to the CMOS sensor having a non-shared-transistor configuration disclosed in Japanese Patent Application Laid-Open No. H11-122532.

An object of the present invention is to prevent the sensitivity difference while realizing miniaturization by a shared-transistor configuration.

SUMMARY OF THE INVENTION

The present inventor has found that, in a CMOS sensor having a shared-transistor configuration, a sensitivity difference between pixels is more likely to arise relative to a CMOS sensor having a non-shared-transistor configuration, and that the reason for this lies in translational symmetry of a photodiode and shared transistor, especially of a photodiode and transfer MOS transistor.

Specifically, in the CMOS sensor having a shared-transistor configuration, translational symmetry with respect to the position of shared transistors has not been taken into consideration. In Japanese Patent Application Laid-Open No. 2000-232216 in which an exemplary pixel layout of a shared-transistor configuration is disclosed, a single row selection switch and a single reset switch are shared by plural pixels. Consequently, the relative position observed from each pixel which shares the switch is not symmetrical; accordingly, it does not have translational symmetry. Further, in the same patent application, there is no translational symmetry for the transfer switch, either.

The present inventor has found that when translational symmetry in the layout (especially, photodiode and transfer MOS transistor) within the unit cell is lost, a characteristic difference between pixels can arise, and a characteristic difference of charge transfer from the photodiode is especially likely to arise; thus, when there is a difference in the alignment of the active region and gate, a difference in the fringe electric field from the gate can arise, thus producing a sensitivity difference. Even when there is a difference in the alignment of the active region and gate, if translational symmetry is maintained, the difference arises in the same way for each pixel; thus a sensitivity difference hardly arises.

The present invention was made in view of the above-described technical background to provide a solid state imaging device having disposed therein a plurality of unit cells including: a plurality of photoelectric conversion regions; a plurality of transfer switch means provided corresponding to the plurality of photoelectric conversion regions, respectively; and common amplification means which amplifies and outputs signals read from the plurality of photoelectric conversion regions, wherein each pair within the unit cell, composed of the photoelectric conversion region and the transfer switch means provided corresponding to the photoelectric conversion region, has translational symmetry with respect to one another.

Here, the term "translational symmetry" means that, when a pair of photoelectric conversion region and transfer switch moves in parallel in an identical direction by a given interval (pixel pitch, i.e., pitch of photoelectric conversion region), the pair of photoelectric conversion region and transfer switch coincides with another pair of photoelectric conversion region and transfer switch.

According to another aspect of the present invention, there is provided an imaging device having disposed therein is a plurality of unit cells including: a plurality of photoelectric conversion regions; a plurality of floating diffusion regions provided corresponding to the plurality of photoelectric conversion regions, respectively; a plurality of MOS transistors for transferring signal charges of the photoelectric conversion region to the floating diffusion region; and common amplification means which amplifies and outputs signals read from the plurality of photoelectric conversion regions, wherein each of the photoelectric conversion regions is disposed at a first pitch; each of the MOS transistor gate electrodes is disposed at a second pitch; each of the floating diffusion regions is disposed at a third pitch; and the first, second and third pitches are equal to each other.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 is a plan view showing a color filter configuration of a solid state imaging device according to the fourth embodiment of the present invention;

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Embodiments of the present invention will be described below in detail.

Embodiment 1

Figure 1:
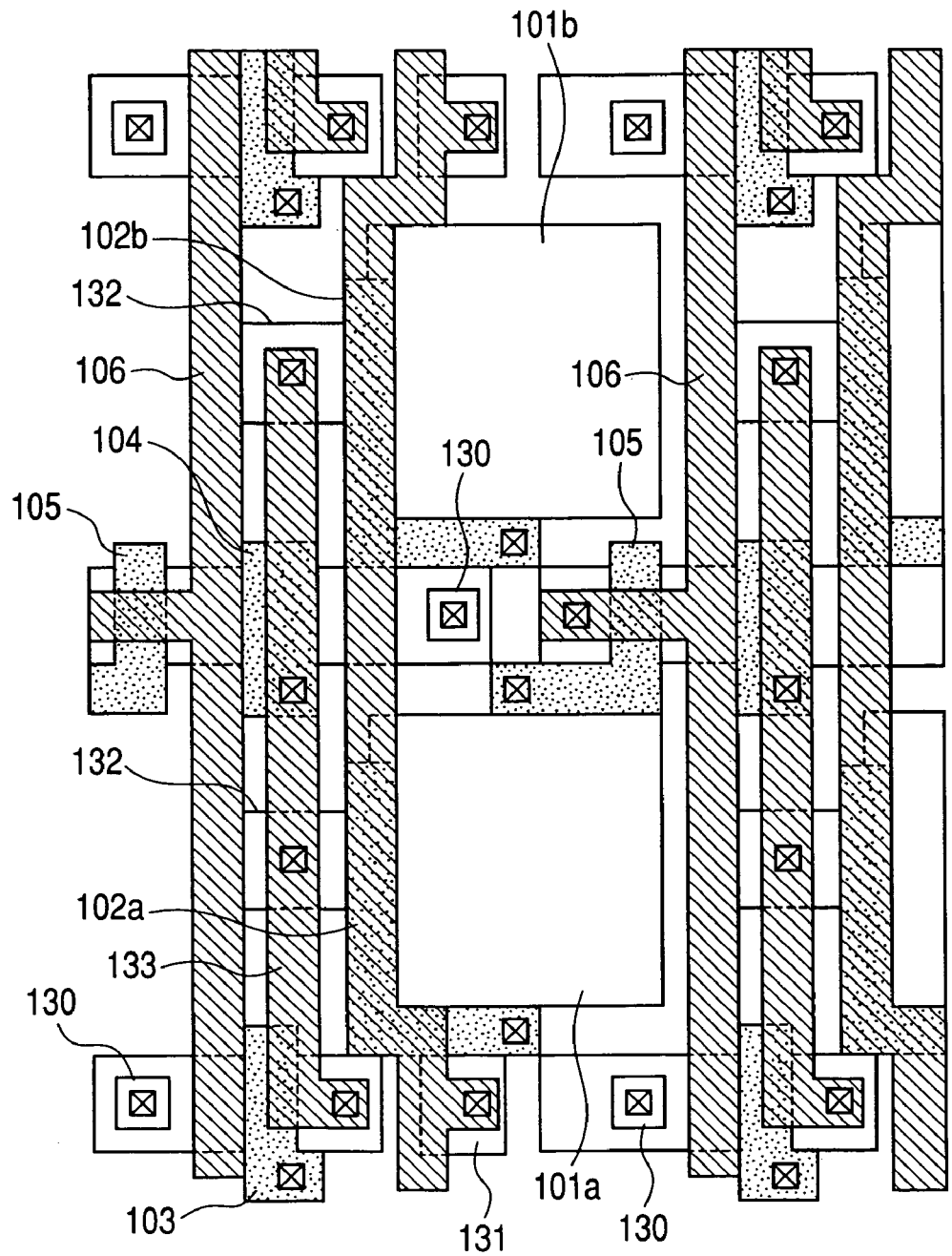
FIG. 1 is a plan view showing a layout of a unit cell of a solid state imaging device according to a first embodiment of the present invention.
Figure 2:
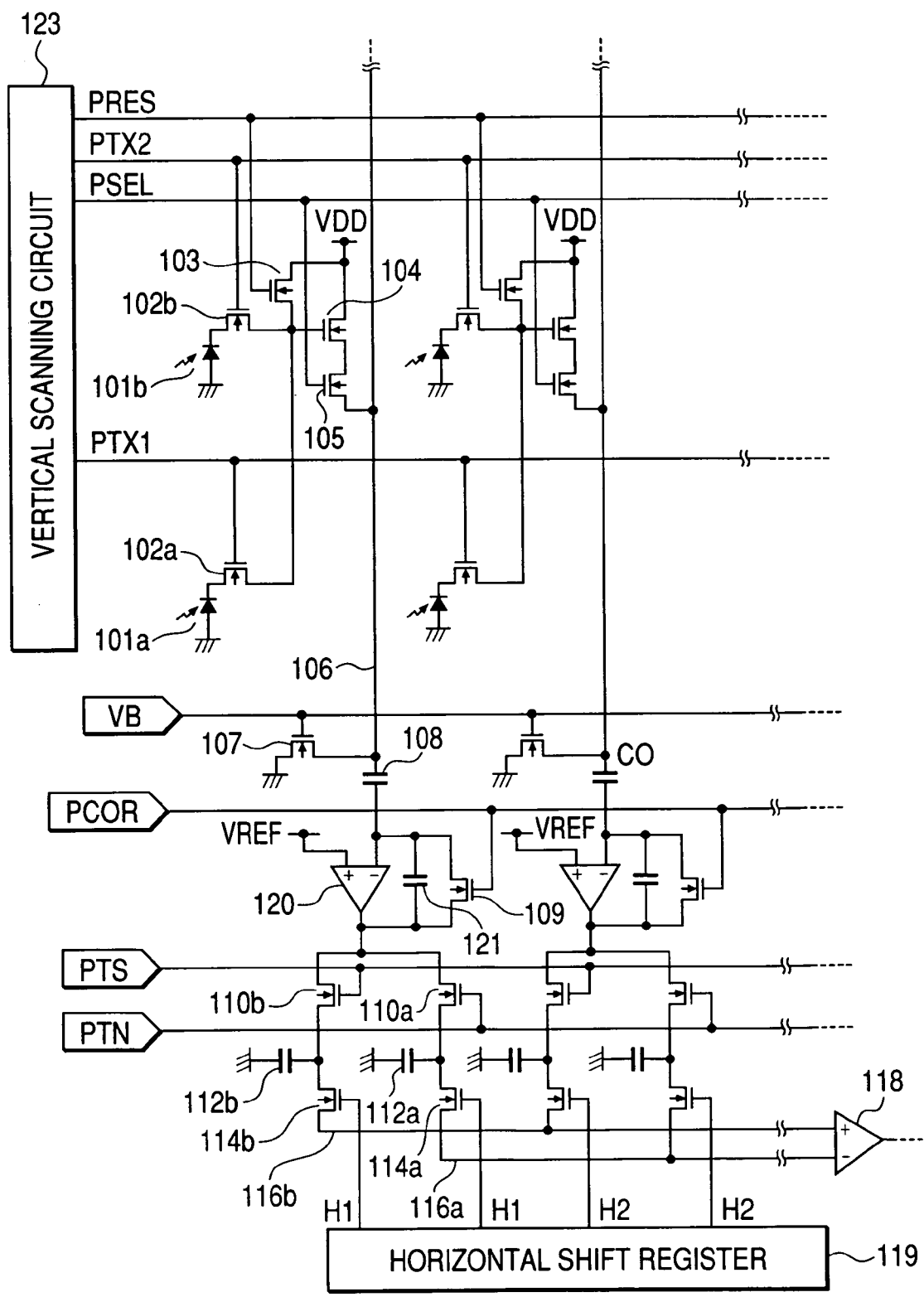
FIG. 2 is an equivalent circuit diagram of the solid state imaging device according to the first embodiment of the present invention.

An imaging device according to a first embodiment of the present invention will be described. FIG. 1 is a plan view of a unit cell of an imaging device according to the first embodiment. FIG. 2 is an equivalent circuit diagram of the imaging device according to the present embodiment, in which pixels having the layout shown in FIG. 1 are disposed two-dimensionally.

In FIG. 2, the unit cell includes photodiodes 101A and 101B being a photoelectric conversion element, and a common amplification MOSFET 104 which amplifies signals generated in the photodiodes 101A and 101B, and further, a reset MOSFET 103 acting as a common reset switch which resets the input of the amplification MOSFET 104 to a predetermined voltage, and a row selecting MOSFET 105 acting as a common row selecting switch which controls conduction between the source electrode of the amplification MOSFET 104 and a vertical output line 106. In addition, transfer MOSFET 102A and MOSFET 102B acting as a transfer switch are provided corresponding to the photodiodes 101A and 101B, respectively. Here, two photodiodes are formed in the unit cell; therefore the unit cell includes two pixels.

In FIG. 1, reference numerals 101A and 101B denote N type diffusion regions disposed in a P well (a P well and N type diffusion region constitute a PN junction); 104 the gate electrode of the amplification MOSFET; 103 the gate electrode of the reset MOSFET; 105 the gate electrode of the row selecting MOSFET; 102A and 102B the gate electrodes of the transfer MOSFETs; 130 an N type dopant region connected to an electric power source (VDD); 131 a P type dopant region (well contact) connected to the ground.

Charges accumulated in the photodiodes 101A and 101B are transferred to each floating diffusion region 132 via the transfer MOSFETs 102A and 102B, respectively. Each of the floating diffusion regions 132 are connected to the gate electrode of the amplification MOSFET 104 and the source electrode of the reset MOSFET 103 via a wire 133 in a shared manner. As evident from FIG. 1, the relative position between the transfer MOSFETs 102A and 102B and the photodiodes 101A and 101B has translational symmetry. In the transfer MOSFETs 102A and 102B, part of the N type diffusion regions 101A and 101B acts as the source region thereof, and the floating diffusion region 132 acts as the drain region thereof. If a pair of the photoelectric conversion region and transfer switch has translational symmetry, this means that, when the N type diffusion region 101A of the photodiode, the gate electrode of the transfer MOSFET 102A and the floating diffusion region acting as the drain region of the transfer MOSFET 102A move in a direction of row by a pixel pitch, they coincide with the N type diffusion region 101B of the photodiode, the gate electrode of the transfer MOSFET 102B and the floating diffusion region acting as the drain region of the pixel transfer MOSFET 102B, respectively. Accordingly, it can also be said that each of the photoelectric conversion regions is disposed at a first pitch; each of the transfer MOSFET gate electrodes is disposed at a second pitch; each of the floating diffusion regions is disposed at a third pitch; the first, second and third pitches are equal to each other.

Accordingly, when the transfer MOSFET 102A and photodiode 101A are moved in parallel by a pixel pitch, the transfer MOSFET 102A and photodiode 101A coincide with the transfer MOSFET 102B and photodiode 101B. By disposing the components in this way so as to have translational symmetry, a systematic difference of transfer characteristics is prevented from arising, whereby a sensitivity difference can be prevented.

The photodiodes 101A is disposed in an odd number row, and the photodiode 101B is disposed in an even number row; this disposition is repeated, thereby constituting an area sensor. The transfer MOSFET 102A is driven by transfer pulse PTX1, and the transfer MOSFET 102B is driven by transfer pulse PTX2. The reset MOSFET 103 being shared is driven by reset pulse PRES. The row selecting MOSFET 105 is driven by row selecting pulse PSEL.

Figure 3:
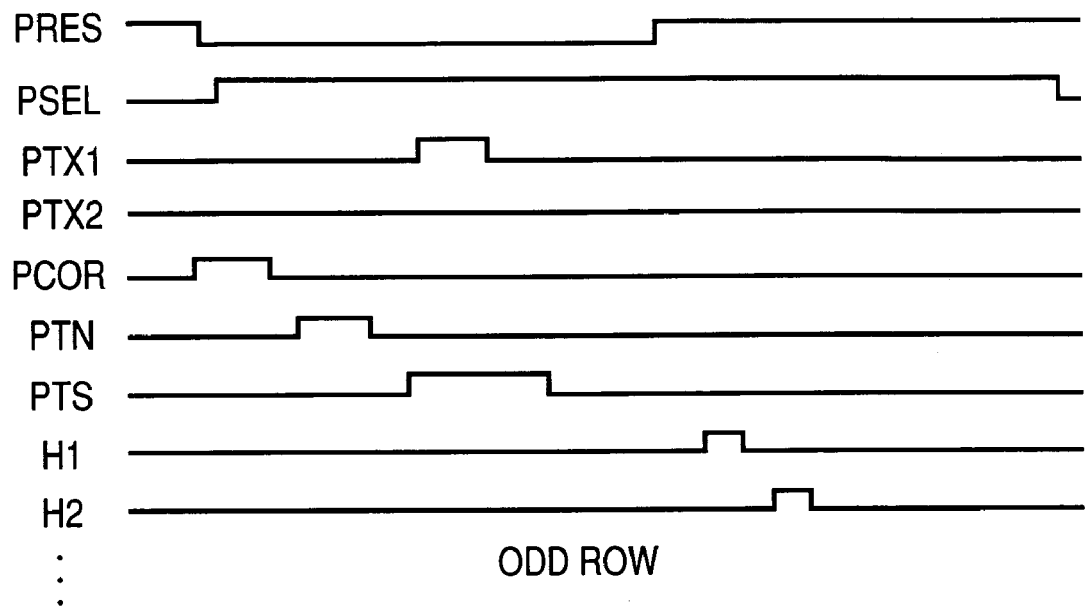
FIG. 3 is a drive pulse timing chart of the solid state imaging device according to the first embodiment of the present invention.
Figure 4:
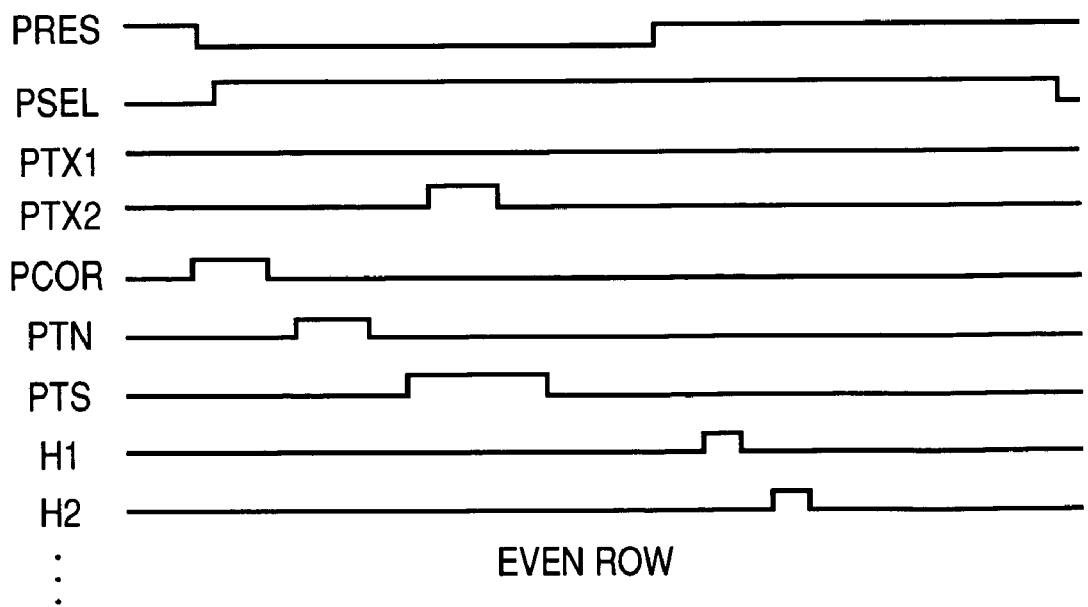
FIG. 4 is a drive pulse timing chart of the solid state imaging device according to the first embodiment of the present invention.

The operation of the imaging device will be described with reference to drive pulse timing charts of FIGS. 3 and 4. Assume that, before a read operation, a predetermined time period of exposure has elapsed, whereby photo charges have been accumulated in the photodiodes 101A and 101B. As shown in FIG. 3, firstly pixel reset pulse PRES is changed from a high level to a low level with respect to a row selected by a vertical scanning circuit 123, whereby the reset of the gate electrode of the amplification MOSFET 104 is released. At this time, a voltage corresponding to a dark state is held in a capacitor (hereinafter referred to as Cfd) of the floating diffusion region connected to the gate electrode. Subsequently, when row selecting pulse PSEL becomes a high level, the output in a dark state is introduced onto a vertical output line 106. At this time, the operational amplifier 120 is in a voltage follower state, and the output of the operational amplifier 120 is approximately equal to a reference voltage VREF. After a predetermined time period elapses, clamp pulse PC0R is changed from a high level to a low level, whereby the output in a dark state on the vertical output line 106 is clamped. Subsequently, pulse PTN becomes a high level, and the transfer gate 110A is turned on, whereby the dark signal, including an offset of the operational amplifier 120, is stored in a holding capacitance 112A. Then the transfer MOSFET 102A is made a high level by transfer pulse PTX1 for a predetermined time period, whereby the photo charges accumulated in the photodiode 101A are transferred to the gate electrode of the amplification MOSFET 104. Meanwhile, the transfer MOSFET 102B, kept at a low level, is in a waiting state with the photo charges of the photodiode 101B being held. Here, when the transfer charge is an electron and Q is the absolute value of the amount of transferred charges, the gate potential is reduced by Q/CFK. In response to this, an output in a bright state is introduced onto the vertical output line 106. When Gsf is the source follower gain, variation ΔVv1 of vertical output line potential Vv1 relative to the output in a dark state is expressed as the following formula.

$$\Delta Vvl = -\frac{Q}{Cfk} \cdot Gsf \quad \text{[Formula 1]}$$

wherein Cfk is the capacitance of the dark state voltage.

This potential variation is amplified by an inverting amplifier composed of the operational amplifier 120, a clamp capacitor 108 and feedback capacitor 121. In combination with formula 1, output Vct is expressed as the following formula.

$$Vct = VREF + \frac{Q}{Cfk} \cdot Gsf \cdot \frac{C0}{Cf} \quad \text{[Formula 2]}$$

where C0 indicates clamp capacitance, and Cf indicates feedback capacitance. The output Vct is stored in another holding capacitor 112B during a time period when pulse PTS becomes a high level and the transfer gate is in the ON state. Subsequently, horizontal transfer switches 114B and 114A are sequentially selected by scanning pulses H1, H2 . . . generated by a horizontal shift register 119, whereby the signals held at the accumulation capacitors 112B and 112A are read out onto horizontal output lines 116B and 116A, and then supplied to an output amplifier 118 to be outputted as a differential signal. In the operation described until now, a read operation for one odd number row in which the photodiode 101A is disposed is completed.

Subsequently, a read operation approximately similar to that for the odd number row is repeated for the photodiode 101B of the even number row. The difference from the odd number row is that, as shown in FIG. 4, transfer pulse PTX2 instead of transfer pulse PTX1 becomes a high level, whereby the transfer MOSFET 102B is turned on. At the time when the operation of reading photo charges of the photodiode 101B disposed in the even number row is terminated, pixel outputs for two rows have been read; this operation is repeatedly performed for the entire image plane, thereby outputting one picture image. In an imaging device having a unit cell composed of two pixels, shown in FIG. 4 of Japanese Patent Application Laid-Open No. 2000-232216, which does not have translational symmetry, there is no translational symmetry in the photodiode and transfer MOSFET. Consequently, a difference arises between the amount of charges read from one photodiode of the unit cell and that read from the other photodiode. Thus the optical output of odd number row is different from that of even number row, creating periodical noises to deteriorate the picture quality. With the imaging device according to the present embodiment of the present invention, however, such periodical noises are not created, whereby a satisfactory picture image can be obtained.

Translational symmetry within a unit cell is described here. However, needless to say, unit cells neighboring each other in row and column directions have translational symmetry with one another with respect to unit cell pitch.

Embodiment 2

Figure 5:
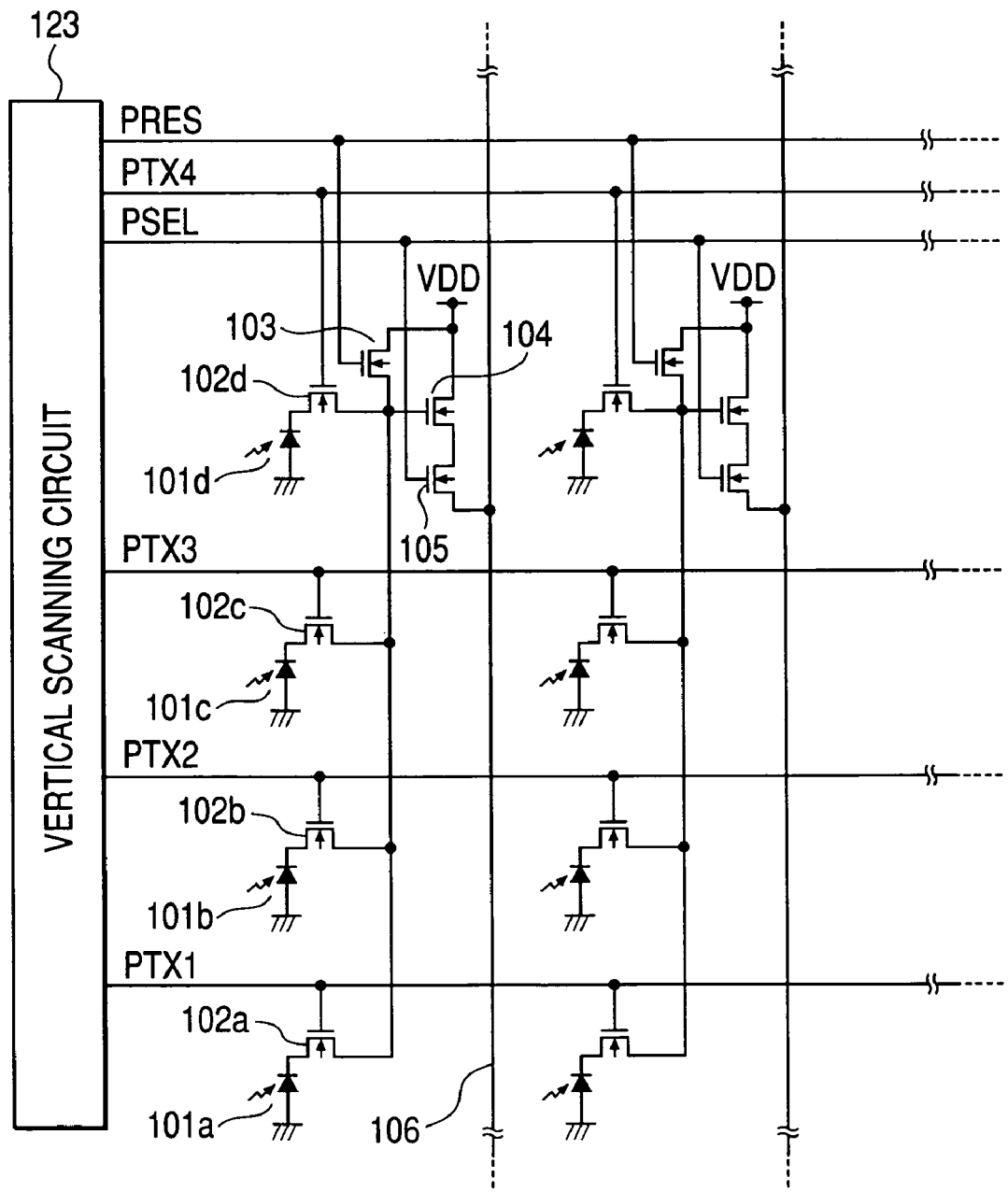
FIG. 5 is an equivalent circuit diagram of a solid state imaging device according to a second embodiment of the present invention.
Figure 6:
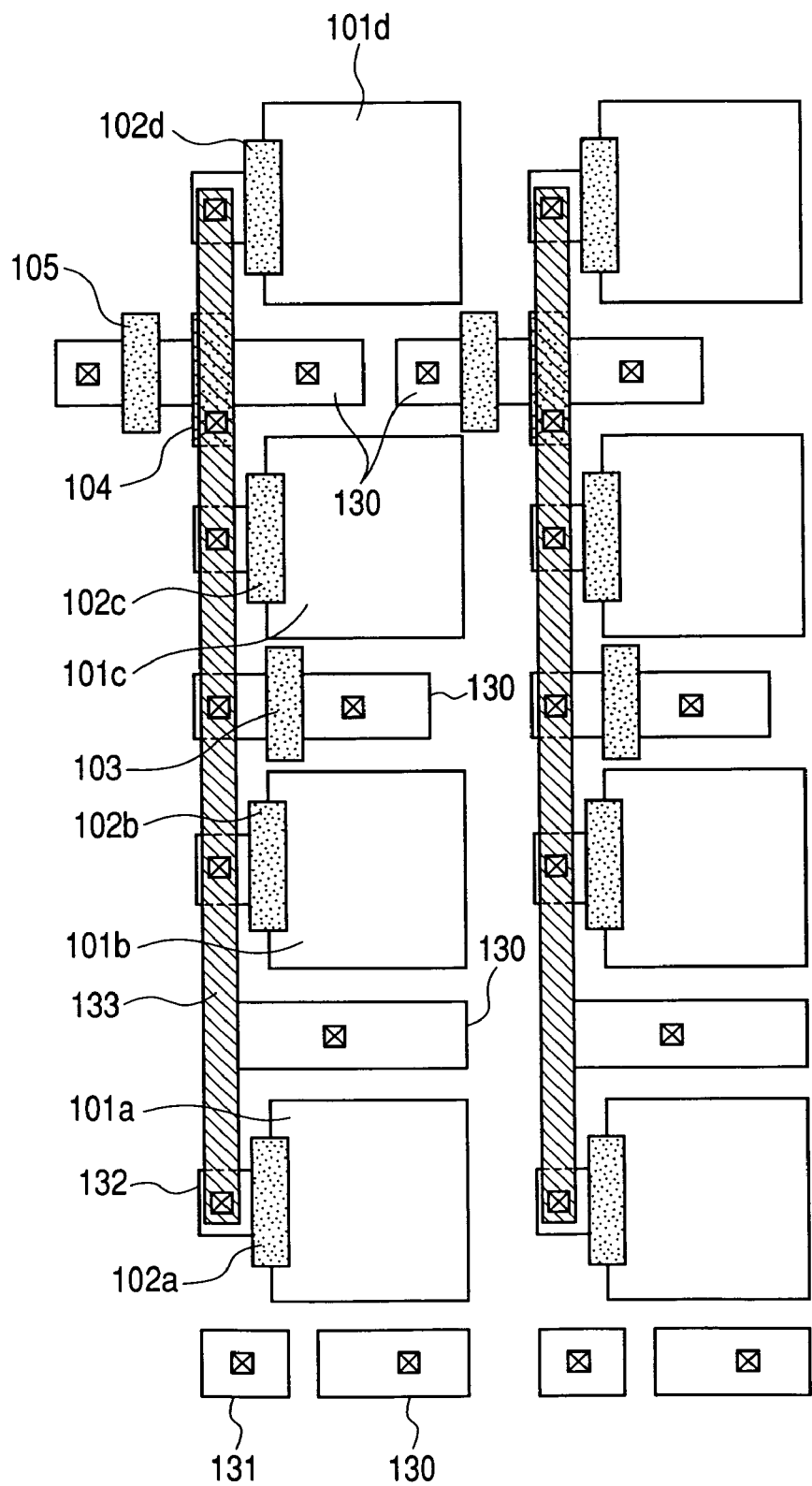
FIG. 6 is a plan view showing a layout of a unit cell of the solid state imaging device according to the second embodiment of the present invention.

An imaging device according to a second embodiment of the present invention will be described. FIG. 5 is an equivalent circuit diagram of an imaging device according to the second embodiment, in which one portion relating to 2×4 pixels selected from among pixels arranged two-dimensionally is shown. In the imaging device according to the present embodiment, four pixels, sharing an amplification MOSFET, reset MOSFET and row selecting MOSFET, constitute a unit cell. FIG. 6 is a plan view showing a layout of these pixels. In FIGS. 5 and 6, the same reference numerals are applied to constituent components corresponding to FIGS. 2 and 1, and hence repeated explanation thereof is omitted. The shape of the gate electrode of a transfer MOSFET of FIG. 6 is apparently different from that of the gate electrode of a transfer MOSFET of FIG. 1. However, this is due to simplification; actually the shape of the gate electrode of a transfer MOSFET of FIG. 6 is identical to that of the gate electrode of a transfer MOSFET of FIG. 1 (the same applies to Embodiments 3 and 4).

In FIG. 6, reference numerals 101A to 101D denote N type diffusion regions of photodiodes disposed in P wells (a P well and N type diffusion region constitute a PN junction); reference numerals 102A to 102D denote the gate electrodes of transfer MOSFETs.

A reset MOSFET 103, amplification MOSFET 104 and row selecting MOSFET 105 are shared by four pixels, and photodiodes 101A, 101B, 101C and 101D are disposed in lines 4n-3, 4n-2, 4n-1 and 4n, respectively (n being a natural number). A transfer MOSFETs 102A, 102B, 102C and 102D are arranged in equivalent positions relative to the photodiodes 101A, 101B, 101C and 101D, respectively, thus having translational symmetry. Consequently, a sensitivity difference between the four pixels is reduced. The number of transistors within a unit cell is 7; the number of transistors per pixel is 1.75. This is advantageous in reducing pixel size. In an imaging device without translational symmetry, when a four-pixel shared transistor configuration is employed, fixed-pattern noises having a period of four rows caused by a sensitivity difference are generated in many cases. With the imaging device of the present embodiment, such periodical noises are not generated; thus a satisfactory picture image can be obtained.

Embodiment 3

Figure 7:
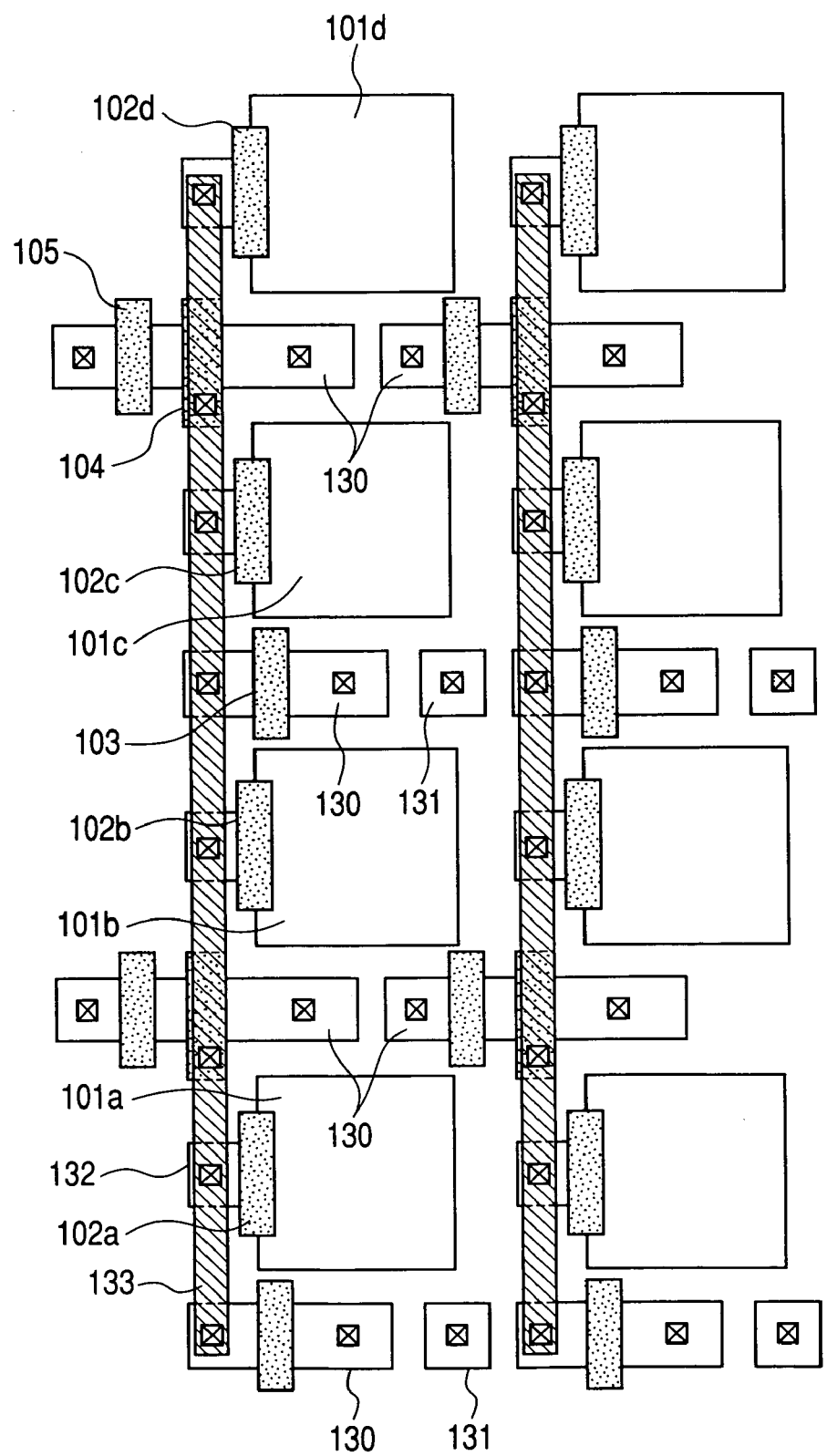
FIG. 7 is a plan view showing a layout of a unit cell of a solid state imaging device according to a third embodiment of the present invention.
Figure 8:
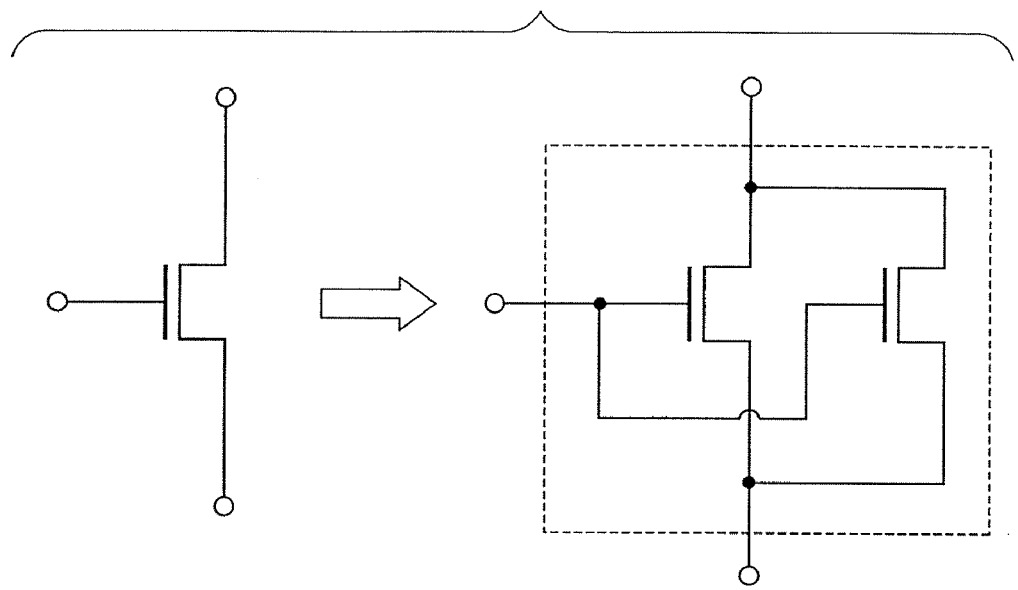
FIG. 8 is a view showing an insulating gate type transistor connected in parallel.

An imaging device according to a third embodiment of the present invention will be described. The equivalent circuit of an imaging device according to the third embodiment is similar to that of the second embodiment. FIG. 7 is a plan view showing a layout of the pixels. In FIG. 7, the same reference numerals are applied to constituent components corresponding to FIG. 6, and hence repeated explanation thereof is omitted. A reset MOSFET 103, amplification MOSFET 104 and row selecting MOSFET 105 are shared by four pixels, and photodiodes 101A, 101B, 101C and 101D are disposed in lines 4n-3, 4n-2, 4n-1 and 4n, respectively (n being a natural number). A transfer switches 102A, 102B, 102C and 102D are arranged in equivalent positions relative to the photodiodes 101A, 101B, 101C and 101D, respectively, thus having translational symmetry. Consequently, a sensitivity difference between the four pixels does not arise. A feature of the imaging device of the present embodiment is that, as shown in FIG. 8, in the reset MOSFET 103, amplification MOSFET 104 and row selecting MOSFET 105, two MOSFETs each being an unit element is connected in parallel to each other. Accordingly, a gate width being effectively twice that of Embodiment 2 is obtained. Consequently, a restraint arises in the minimal size of a transistor; this is slightly less advantageous in the reduction of size of a pixel than an imaging device of the second embodiment. However, the drive force of a MOSFET is raised, whereby a more high speed pixel read operation becomes possible. While fixed-pattern noises having a period of four rows caused by a sensitivity difference are generated in an imaging device without translational symmetry, such periodical noises can be reduced in the imaging device of the present embodiment similarly to the imaging device of the second embodiment, whereby a satisfactory picture image can be obtained.

The gate electrodes of two reset switches 103 and the gate electrodes of two row selecting switches 105 are connected to common drive lines, respectively.

Embodiment 4

Figure 9:
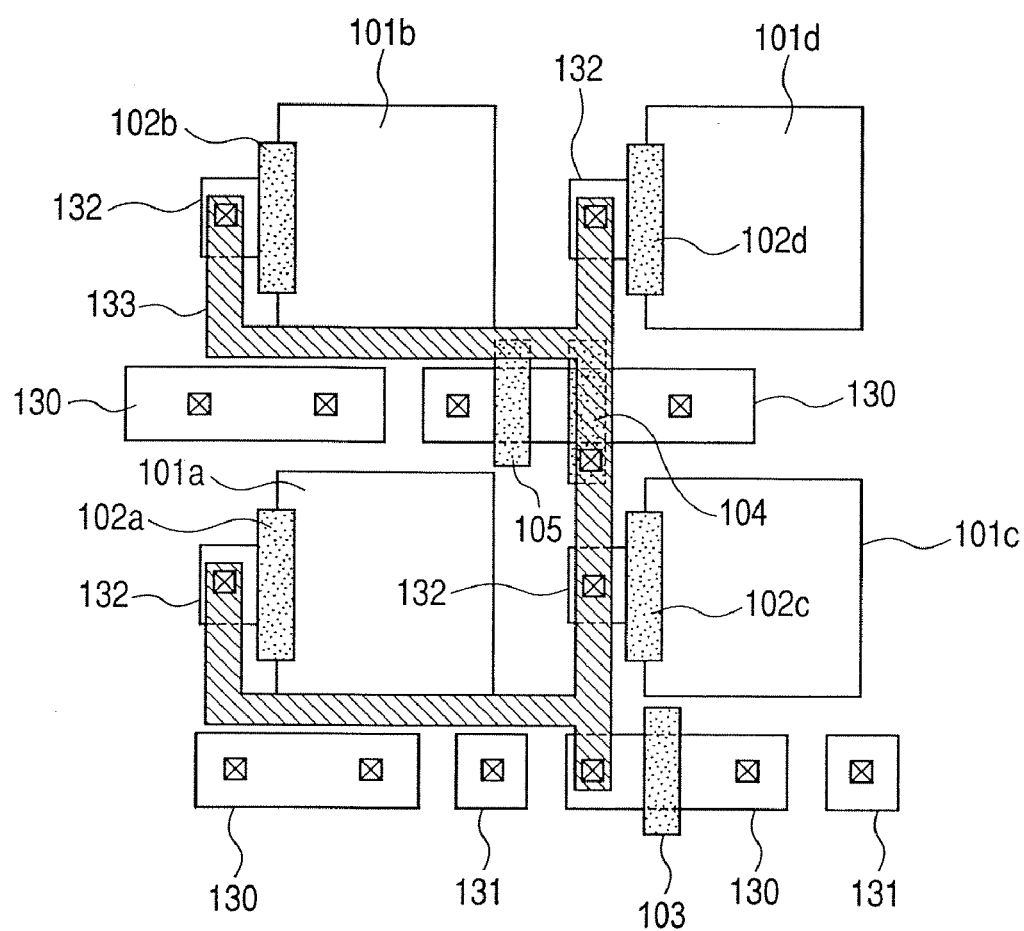
FIG. 9 is a plan view showing a layout of a unit cell of a solid state imaging device according to a fourth embodiment of the present invention.
Figure 10:
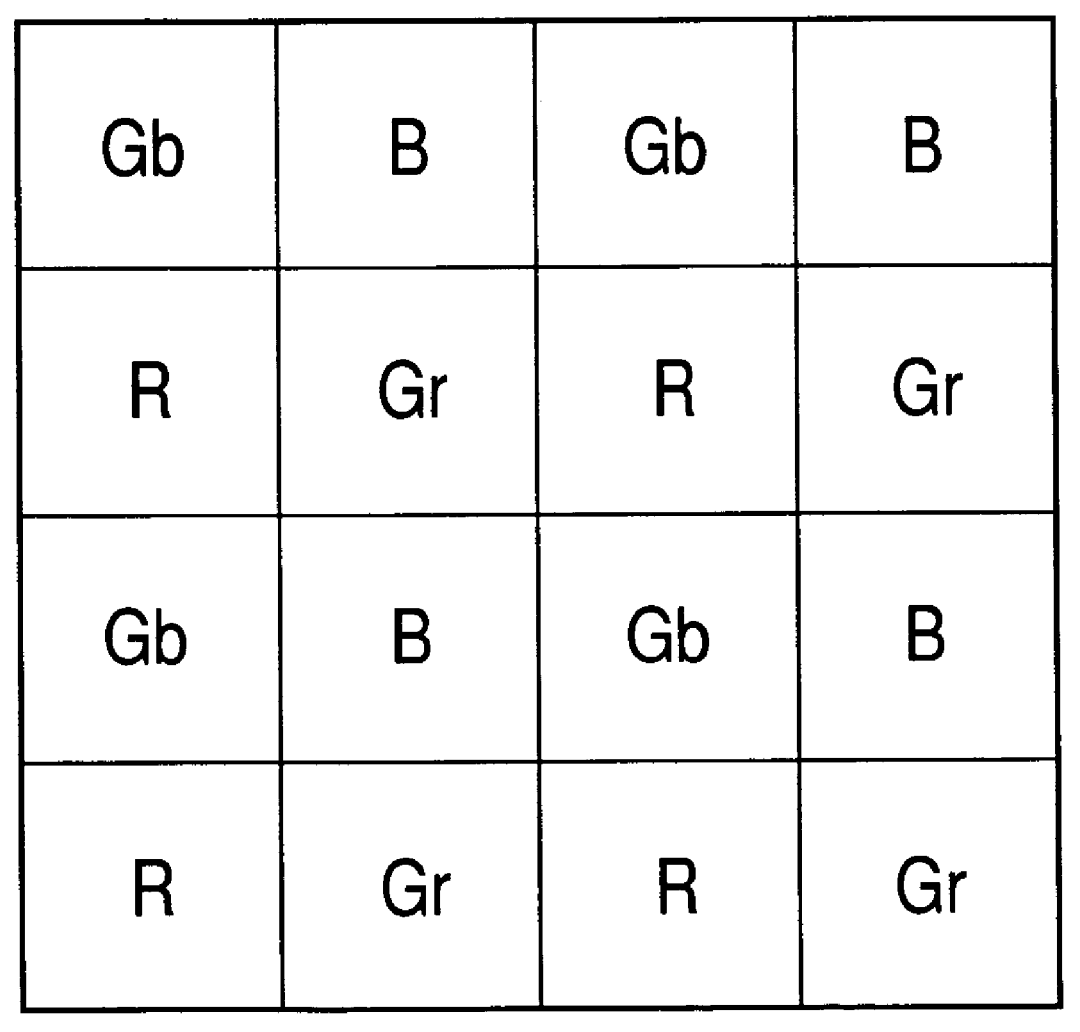

An imaging device according to a fourth embodiment of the present invention will be described. The equivalent circuit of an imaging device according to the fourth embodiment is similar to that of the second and third embodiments. FIG. 9 is a plan view showing a layout of the pixels. In FIG. 9, the same reference numerals are applied to constituent components corresponding to FIG. 1, and hence repeated explanation thereof is omitted. A reset MOSFET 103, amplification MOSFET 104 and row selecting MOSFET 105 are shared by four pixels, and photodiodes 101A, 101B, 101C and 101D are disposed so that a unit cell is formed in a rectangular shape of 2×2. As shown in FIG. 10, a color filter configuration of bayer arrangement is employed in which green filters are arranged in a checkered pattern. In FIG. 10, reference, characters Gb and Gr each denote a green filter; B a blue filter; R a red filter. Accordingly, even when the capacitance of a floating diffusion region 132 to which four pixels are connected in a shared manner varies, or even when the amplification gain of a common amplification MOSFET 104 varies, since the gain within a picture element varies by the same ratio, the color ratio within the picture element does not vary. A transfer MOSFET 102A, MOSFET 102B, MOSFET 102C and MOSFET 102D are arranged in equivalent positions relative to the photodiodes 101A, 101B, 101C and 101D, respectively, thus having translational symmetry. Accordingly, there does not arise a sensitivity difference between the photodiodes 101B and 101C corresponding to filters Gr and Gb which should have the same color and the same sensitivity. Consequently, while periodical fixed-pattern noises caused by a sensitivity difference are generated in an imaging device without translational symmetry, such periodical noises are not generated reduced in the imaging device of the present embodiment, whereby a satisfactory picture image can be obtained.

Embodiment 5

Figure 11:
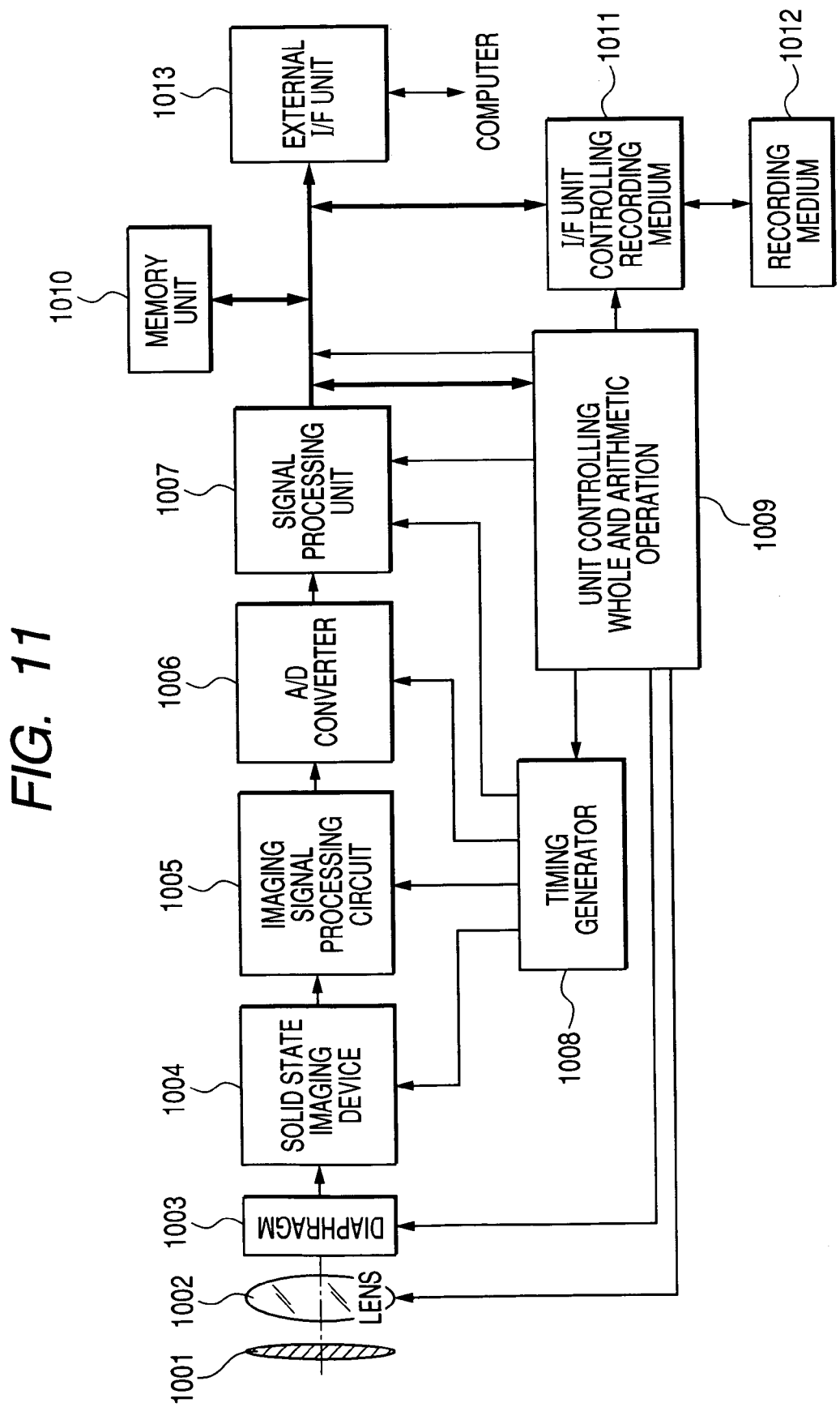
FIG. 11 is a conceptual view showing an imaging system according to a fifth embodiment of the present invention.
Figure 12:
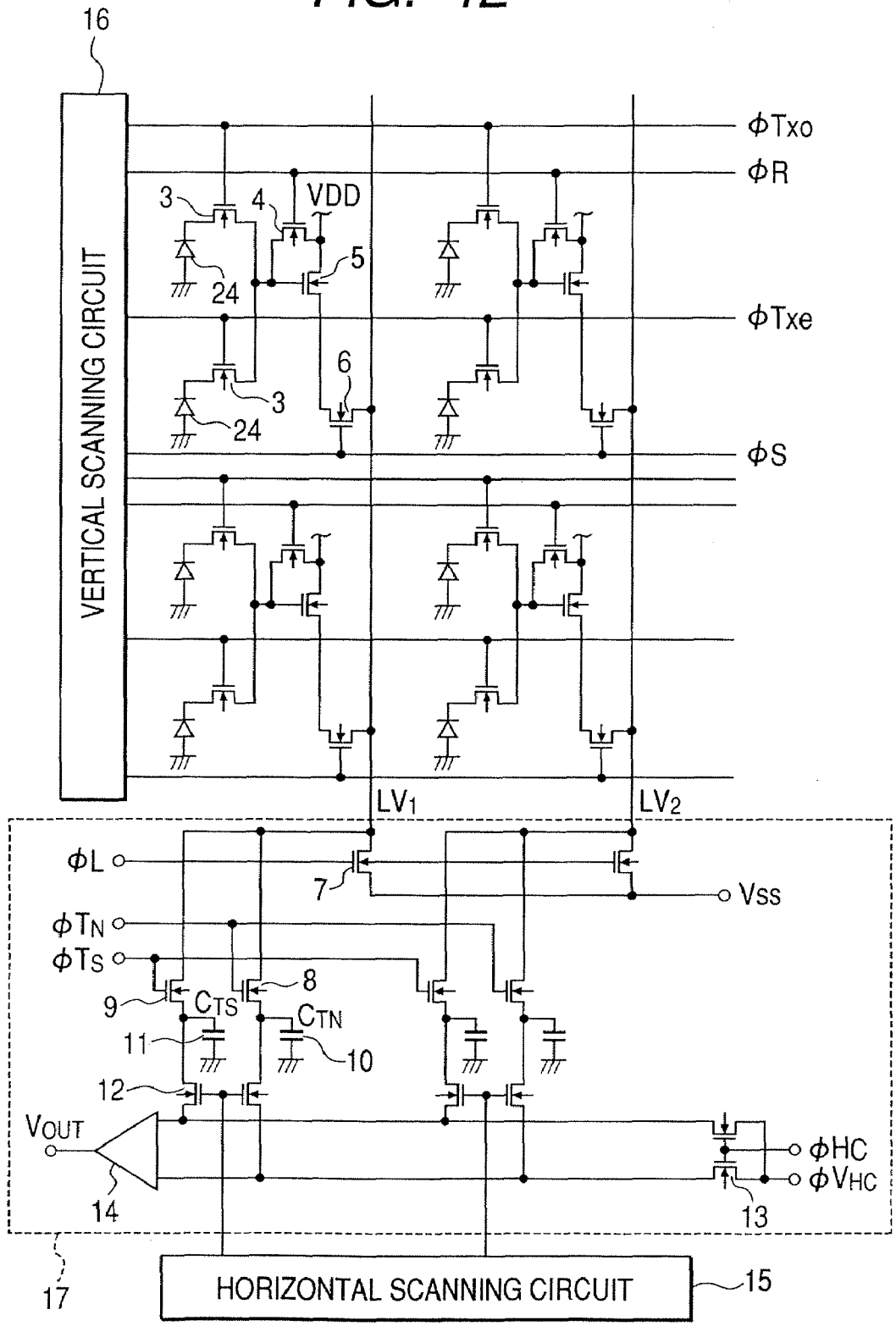
FIG. 12 is an equivalent circuit diagram of a solid state imaging device of conventional art.

FIG. 11 is a configuration diagram of an imaging system using the imaging device according to each of the above described embodiments. The imaging system includes a barrier 1001 which doubles as a lens protect and main switch; a lens 1002 which focuses the optical image of an object on an image sensor 1004; an aperture 1003 which varies the amount of light passing through the lens 1002; and further, the image sensor 1004 (corresponding to the imaging device described in each of the above described embodiments) which imports an object focused by the lens 1002 as an image signal; an image signal processing circuit 1005 which processes an image signal outputted from the image sensor 1004 for various corrections, clamping, and so on.; an A/D converter 1006 which converts the image signal outputted from the image sensor 1004 from analog to digital form.; a signal processing section 1007 which performs various corrections and data compression on an image data outputted from the A/D converter 1006; and a timing generation section 1008 which outputs various timing signals to the image sensor 1004, image signal processing circuit 1005, A/D converter 1006 and signal processing section 1007. Each of the circuits 1005 to 1008 may be formed on the same chip as the solid state image sensor 1004. The imaging system also includes an overall-control and arithmetic processing section 1009 which performs various arithmetic processings and controls the entire still video camera; a memory section 1010 which temporarily stores image data; a recording medium control interface section 1011 for recording or reading data onto/from a recording medium; a detachable recording medium 1012, such as a semiconductor memory, for recording or reading image data; and an external interface (I/F) section 1013 for communicating with an external computer or the like.

The operation of FIG. 11 will now be described. When the barrier 1001 is opened, the main switch is turned on. Subsequently, the electrical power source of the control system is turned on, and further the electrical power sources of the imaging system circuits, such as the A/D converter 1006, are turned on. Then, in order to control the light exposure, the overall-control and arithmetic processing section 1009 opens the aperture 1003; a signal outputted from the image sensor 1004 is outputted directly to the A/D converter 1006 via the image signal processing circuit 1005. The A/D converter 1006 converts the signal and outputs the resultant signal to the signal processing section 1007. Based on the data, the signal processing section 1007 causes the overall-control and arithmetic processing section 1009 to perform the exposure calculation.

The brightness is determined from the photometry result, and the overall-control and arithmetic processing section 1009 controls the aperture according to the determination result. Subsequently, based on the signal outputted from the image sensor 1004, high-frequency components are extracted, and the distance to the object is calculated by the overall-control and arithmetic processing section 1009. Then the lens 1002 is driven to determine whether or not it is in focus; if it is determined that it is out of focus, the lens 1002 is driven again to perform ranging.

After it is confirmed that it is in focus, the real exposure is initiated. After the exposure is completed, an image signal outputted from the image sensor 1004 is subjected to corrections, etc. in the image signal processing circuit 1005, and converted from analog to digital form by the A/D converter 1006, and got through the signal processing section 1007, and stored in the memory section 1010 by the overall-control and arithmetic processing section 1009. Then the data stored in the memory section 1010 is recorded through the recording medium control interface (I/F) section 1011 onto a detachable recording medium 1012, such as a semiconductor memory, under the control of the overall-control and arithmetic processing section 1009. Alternatively; the data may be supplied directly to a computer or the like via the external interface (I/F) section 1013 to be subjected to image processing.

The present invention relates to an imaging device for use in a solid state imaging system such as a scanner, video camera and digital still camera.

This application claims priority from Japanese Patent Application No. 2004-254358 filed on Sep. 1, 2004, which is hereby incorporated by reference herein.

What is claimed is:

1. An imaging device comprised of a plurality of unit cells disposed therein, the plurality of unit cells being arranged in a row and column arrangement, and each unit cell including:
   a plurality of photoelectric conversion regions;
   a plurality of floating diffusion regions provided corresponding to the plurality of photoelectric conversion regions, respectively;
   a plurality of MOS transistors, wherein each of the plurality of MOS transistors transfers signal charges of a corresponding one of the plurality of photoelectric conversion regions to a corresponding one of the plurality of floating diffusion regions;
   a common amplifier having an input connected to the plurality of floating diffusion regions and amplifying signals transferred to the plurality of floating diffusion regions from the plurality of photoelectric conversion regions; and
   a common reset transistor, which resets the input of the common amplifier,
   wherein each of the plurality of photoelectric conversion regions of a unit cell is disposed at a first pitch in a column direction, each gate electrode of the plurality of MOS transistors of a unit cell is disposed at a second pitch in the column direction, and each of the plurality of floating diffusion regions of a unit cell is disposed at a third pitch, such that the first pitch, the second, and the third pitch are equal to each other, and
   wherein, for a unit cell, each of the plurality of photoelectric conversion regions of the unit cell is disposed at a fourth pitch in a row direction, each gate electrode of the plurality of MOS transistors of the unit cell is disposed at a fifth pitch in the row direction, and each of the plurality of floating diffusion regions is disposed at a sixth pitch in the row direction, such that the fourth pitch, the fifth pitch, and the sixth pitch are equal to each other, and
   wherein, for photoelectric conversion regions that are adjacent along the column direction, a common amplifier and a common reset transistor are disposed between the adjacent photoelectric conversion regions along the column direction, and, for photoelectric conversion regions that are adjacent along the row direction, a floating diffusion region is disposed between the adjacent photoelectric conversion regions along the row direction.

2. An imaging device according to claim 1, wherein the imaging device is incorporated in an imaging system that includes:
   an optical system, which focuses light on the imaging device; and
   a signal processing circuit, which processes an output signal from the imaging device.

* * * * *